(12) United States Patent  
Chaki

(10) Patent No.: US 10,290,603 B2  
(45) Date of Patent: May 14, 2019

(54) HIGH-FREQUENCY CIRCUIT

(71) Applicant: Mitsubishi Electric Corporation, Tokyo (JP)

(72) Inventor: Shin Chaki, Nagasaki (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/648,526

(22) Filed: Jul. 13, 2017

(65) Prior Publication Data

US 2018/0130764 A1   May 10, 2018

(30) Foreign Application Priority Data

Nov. 10, 2016   (JP) .................................. 2016-219868

(51) Int. Cl.
*H01L 23/66* (2006.01)
*H01L 25/04* (2014.01)
(Continued)

(52) U.S. Cl.
CPC .............. *H01L 24/49* (2013.01); *H01L 23/66* (2013.01); *H01L 24/06* (2013.01); *H01L 24/13* (2013.01); *H01L 24/85* (2013.01); *H01L 24/05* (2013.01); *H01L 2223/6611* (2013.01); *H01L 2223/6655* (2013.01); *H01L 2224/02371* (2013.01); *H01L 2224/04042* (2013.01); *H01L 2224/05548* (2013.01); *H01L 2224/05552* (2013.01); *H01L 2224/06188* (2013.01); *H01L 2224/16137* (2013.01); *H01L 2224/48137* (2013.01);
(Continued)

(58) Field of Classification Search
CPC ......... H01L 24/49; H01L 24/06; H01L 24/13; H01L 24/85; H01L 23/66; H01L 25/042; H01L 25/0655; H01L 25/072; H01L 25/0753; H01L 25/115
See application file for complete search history.

(56) References Cited

U.S. PATENT DOCUMENTS 5,376,902 A * 12/1994 Bockelman ............. H01L 23/66
333/246
5,909,523 A    6/1999 Sakaino et al.
(Continued)

FOREIGN PATENT DOCUMENTS

EP    0533158 A2 *  3/1993  ............ H01L 23/04
JP    63-044733 A    2/1988
(Continued)

*Primary Examiner* — Ida M Soward
(74) *Attorney, Agent, or Firm* — Studebaker & Brackett PC

(57) ABSTRACT

A high-frequency circuit includes: a first substrate; a transmission line formed on the first substrate and having first and second output portions branched from an input portion; a second substrate; first and second pads formed on the second substrate; a first wire connecting the first output portion to the first pad; and a second wire connecting the second output portion to the second pad, wherein an electrical length from the input portion to an edge of the second output portion is longer than an electrical length from the input portion to an edge of the first output portion, and a length from a junction between the second wire and the second output portion to the edge of the second output portion is longer than a length from a junction between the first wire and the first output portion to the edge of the first output portion.

20 Claims, 8 Drawing Sheets

(51) Int. Cl.
*H01L 25/07* (2006.01)
*H01L 25/11* (2006.01)
*H01L 23/00* (2006.01)

(52) U.S. Cl.
CPC ............ *H01L 2224/49107* (2013.01); *H01L 2224/49175* (2013.01); *H01L 2924/10156* (2013.01); *H01L 2924/10157* (2013.01)

(56) References Cited

U.S. PATENT DOCUMENTS

| | | | | |
|---|---|---|---|---|
| 7,091,588 | B2 * | 8/2006 | Akiyama | H01L 23/3107 257/685 |
| 7,242,266 | B2 * | 7/2007 | Peterson | H01P 1/047 333/260 |
| 8,472,196 | B2 * | 6/2013 | Zeng | H01L 23/4952 257/670 |
| 8,482,114 | B2 * | 7/2013 | Spehar | H01L 23/66 257/693 |
| 9,450,650 | B2 * | 9/2016 | Li | H01L 24/00 |
| 9,806,039 | B2 * | 10/2017 | Kosaka | H01L 23/66 |
| 9,947,628 | B2 * | 4/2018 | Takagi | H01L 23/66 |
| 10,008,457 | B2 * | 6/2018 | Burton | H01L 23/645 |
| 2004/0095729 | A1 * | 5/2004 | Vaysse | H01L 24/49 361/710 |
| 2004/0264882 | A1 * | 12/2004 | Torigoe | G02B 6/4201 385/88 |
| 2007/0057366 | A1 * | 3/2007 | Katsumata | H01L 23/5386 257/723 |
| 2007/0096277 | A1 * | 5/2007 | Sutardja | H01L 23/495 257/678 |
| 2010/0140721 | A1 | 6/2010 | Takagi | |
| 2011/0089530 | A1 * | 4/2011 | Strzalkowski | H01L 23/495 257/531 |
| 2011/0194273 | A1 | 8/2011 | Park | |
| 2011/0204980 | A1 * | 8/2011 | Blednov | H03F 1/0288 330/295 |
| 2016/0006399 | A1 * | 1/2016 | Blednov | H03F 1/0288 330/295 |
| 2016/0240488 | A1 * | 8/2016 | Viswanathan | H01L 23/552 |
| 2017/0186727 | A1 * | 6/2017 | Dalal | H01L 25/0655 |
| 2017/0194237 | A1 * | 7/2017 | Kinzer | H01L 23/49575 |

FOREIGN PATENT DOCUMENTS

| | | |
|---|---|---|
| JP | 10-082930 A | 3/1998 |
| JP | 2006-228948 A | 8/2006 |
| JP | 2008-300685 A | 12/2008 |
| JP | 2011-146708 A | 7/2011 |
| JP | 2013-118580 A | 6/2013 |
| JP | 2015-015496 A | 1/2015 |

* cited by examiner

HIGH-FREQUENCY CIRCUIT

BACKGROUND OF THE INVENTION

Field

The present invention relates to a high-frequency circuit.

Background

There are disclosures of connection to independent interconnections using wires for second harmonic matching in a high-frequency circuit (see, for example, Japanese Patent Application Publication No. 2013-118580). There are disclosures of adjusting transmission phases by changing wire lengths without changing contact points of wires and of extending interconnections at both ends of a transistor (see, for example, Japanese Patent Application Publication No. 2015-15496). There are disclosures of techniques for adjusting transmission phase differences by changing the lengths or heights of wires (see, for example, Japanese Patent Application Publication No. 2008-300685). Further, there are disclosures of wire bonding to vertical surfaces (see, for example, Japanese Patent Application Publication Nos. S63-44733, H10-82930, 2006-228948, and 2011-146708), but such disclosures are unrelated to transmission phase adjustment.

A plurality of gate electrodes of a transistor form a row at 90° with respect to the signal propagation direction. The electrical length from an input to a gate electrode in a central portion of the transistor is short, and the electrical length from the input to a gate electrode in a peripheral portion of the transistor is long. Accordingly, if the transistor has many gate electrodes, signal transmission phases differ between the central portion and the peripheral portion of the transistor. This causes the position dependence of the operation of each unit transistor within the transistor and interferes with ideal operation of the transistor.

Internally-matched high-frequency circuits in which transistors are combined in parallel also have a difference in signal propagation distances between a central portion and a peripheral portion. Generally, the central portion is influenced by a coupling between lines, and the electrical length in the central portion tends to be shorter than that in the peripheral portion. Accordingly, the position dependence of the operation of each of the transistors arranged in parallel occurs, and ideal signal distribution and synthesis cannot be performed.

SUMMARY

The present invention has been accomplished to solve the above-described problems, and an object of the present invention is to provide a high-frequency circuit in which operating characteristics can be improved by correcting electrical length differences.

According to the present invention, a high-frequency circuit includes: a first substrate; a transmission line formed on the first substrate and having first and second output portions branched from an input portion; a second substrate; first and second pads formed on the second substrate; a first wire connecting the first output portion to the first pad; and a second wire connecting the second output portion to the second pad, wherein an electrical length from the input portion to an edge of the second output portion is longer than an electrical length from the input portion to an edge of the first output portion, and a length from a junction between the second wire and the second output portion to the edge of the second output portion is longer than a length from a junction between the first wire and the first output portion to the edge of the first output portion.

The present invention can correct electrical length differences of the transmission line by varying the wire bonding positions. Moreover, the line from a wire junction to the edge of the corresponding output portion of the transmission line is an open stub. The length of the open stub increases with increasing wire length. If the parasitic inductance is large, the parallel capacitance for correction also becomes large. Accordingly, the parasitic inductance generated by the wire, which is an unnecessary component, can be reduced by an open stub corresponding to the wire length on an individual wire basis. Thus, operating characteristics of the high-frequency circuit can be improved.

Other and further objects, features and advantages of the invention will appear more fully from the following description.

DESCRIPTION OF EMBODIMENTS

A high-frequency circuit according to the embodiments of the present invention will be described with reference to the drawings. The same components will be denoted by the same symbols, and the repeated description thereof may be omitted.

Embodiment 1

Figure 1:
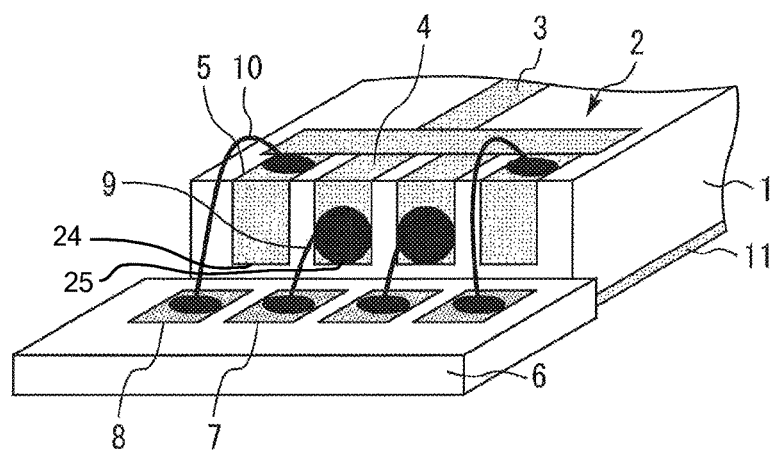
FIG. 1 is a perspective view showing a high-frequency circuit according to Embodiment 1 of the present invention.

FIG. 1 is a perspective view showing a high-frequency circuit according to Embodiment 1 of the present invention. A transmission line 2 is formed on an upper surface and a side surface of a first substrate 1. The transmission line 2 has first and second output portions 4 and 5 branched from an input portion 3. First and second pads 7 and 8 are formed on an upper surface of a second substrate 6. A first wire 9 connects the first output portion 4 to the first pad 7. A second wire 10 connects the second output portion 5 to the second pad 8. The electrical length from the input portion 3 to an edge 24 of the second output portion 5 is longer than the electrical length from the input portion 3 to an edge 25 of the first output portion 4. The length from the junction between the second wire 10 and the second output portion 5 to the edge 24 of the second output portion 5 is longer than the length from the junction between the first wire 9 and the first output portion 4 to the edge 25 of the first output portion 4.

The first and second output portions 4 and 5 extend to a side surface of the first substrate 1 which faces a side surface of the second substrate 6. The first wire 9 is bonded to the first output portion 4 on the side surface of the first substrate 1. The second wire 10 is bonded to the second output portion 5 on the upper surface of the first substrate 1. A ground electrode 11 is formed on a back surface of the first substrate 1.

Figure 2:
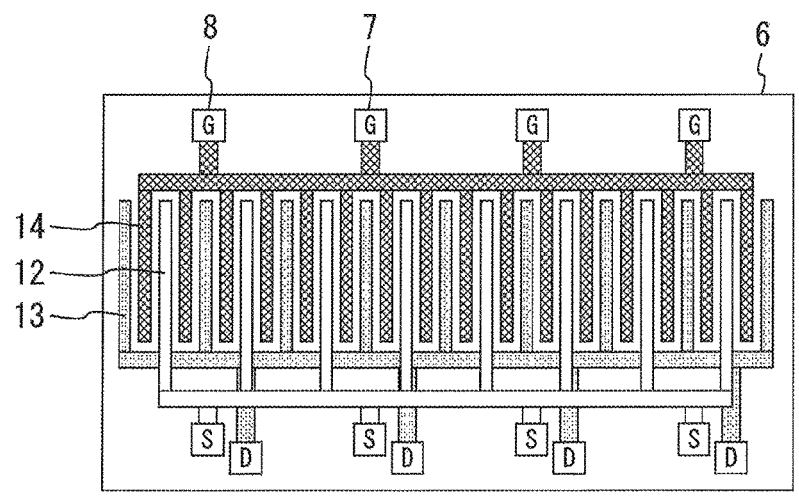
FIG. 2 is a plan view showing the second substrate according to Embodiment 1 of the present invention.

FIG. 2 is a plan view showing the second substrate according to Embodiment 1 of the present invention. A transistor is formed on the second substrate 6. A plurality of source fingers 12 and a plurality of drain fingers 13 are alternately arranged, and a plurality of gate fingers 14 are arranged between adjacent source and drain fingers 12 and 13. The first and second pads 7 and 8 are gate pads connected to the gate fingers 14 of the transistor.

Figure 3:
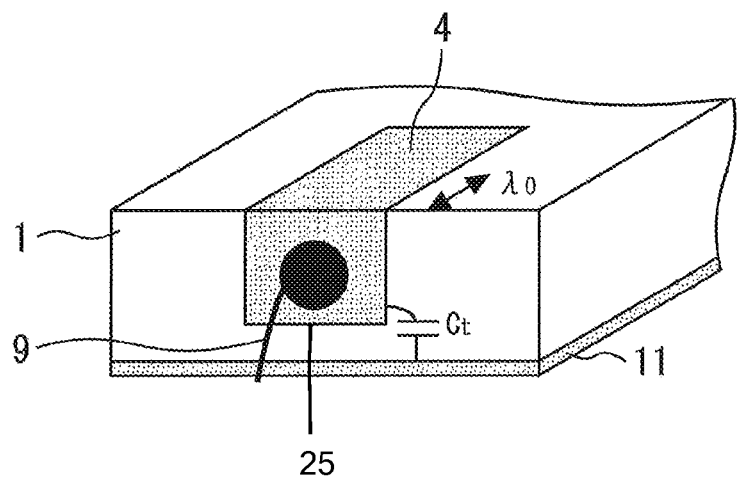
FIG. 3 is a perspective view showing the region of the first output portion having a relatively short electrical length.
Figure 4:
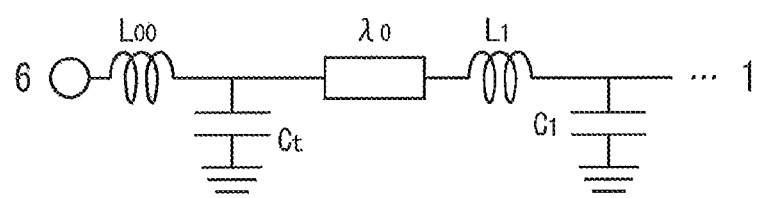
FIG. 4 shows an equivalent circuit of the configuration in FIG. 3.

FIG. 3 is a perspective view showing the region of the first output portion having a relatively short electrical length. FIG. 4 shows an equivalent circuit of the configuration in FIG. 3. Reference signs $L_1$ and $C_1$ are the inductance and the capacitance value of an input matching circuit, $L_{00}$ is the parasitic inductance of the first wire 9, $C_t$ is the capacitance value between the first output portion 4 and the ground electrode 11, and $\lambda_0$ is a wire bonding position difference between the first and second output portions 4 and 5. By virtue of an electrical length corresponding to $\lambda_0$ added to the first output portion 4, the electrical length difference between the first and second output portions 4 and 5 is corrected.

Figure 5:
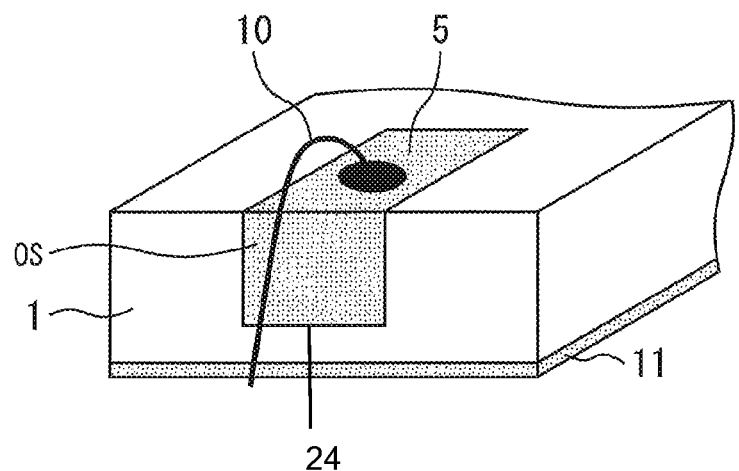
FIG. 5 is a perspective view showing the region of the second output portion having a relatively long electrical length.
Figure 6:
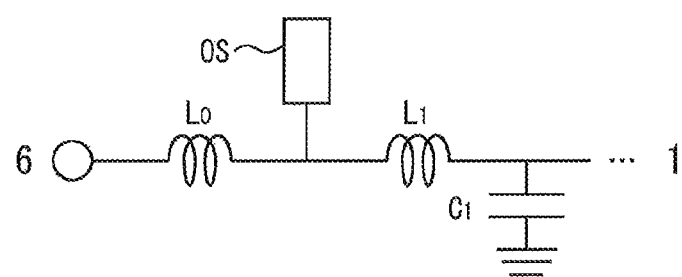
FIG. 6 shows an equivalent circuit of the configuration in FIG. 5.

FIG. 5 is a perspective view showing the region of the second output portion having a relatively long electrical length. FIG. 6 shows an equivalent circuit of the configuration in FIG. 5. The second wire 10 is longer than the first wire 9. Accordingly, the parasitic inductance $L_0$ of the second wire 10 is larger than the parasitic inductance $L_{00}$ of the first wire 9 ($L_0>L_{00}$). The line from the wire junction to the edge 24 of the second output portion 5 is an open stub OS. The influence of the parasitic inductance $L_0$ is reduced by the open stub OS.

Figure 7:
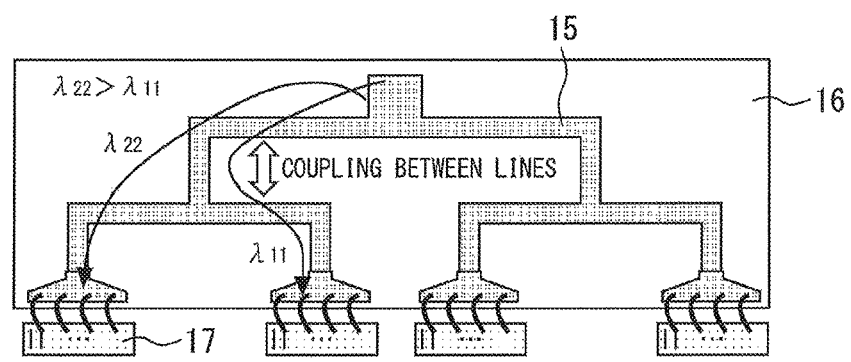
FIG. 7 is a plan view showing an internally-matched high-frequency circuit in which transistors are combined in parallel.

Next, effects of this embodiment will be described with comparisons made with a comparative example. FIG. 7 is a plan view showing an internally-matched high-frequency circuit in which transistors are combined in parallel. A circuit substrate 16 using a distributed parameter transmission line 15 in the shape of a tournament bracket synthesizes signals from a plurality of transistors 17 and distributes a signal to the plurality of transistors 17. The electrical length $\lambda_{11}$ of an inner signal propagation path influenced by a coupling between lines is shorter than the electrical length $\lambda_{22}$ of a signal propagation path in a peripheral portion of the circuit ($\lambda_{22}>\lambda_{11}$).

Figure 8:
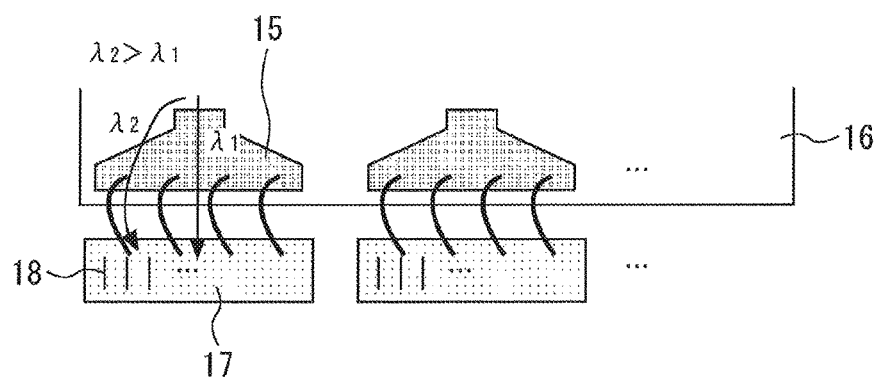
FIG. 8 is a plan view showing wire connection between the circuit substrate and the transistors in FIG. 7.

FIG. 8 is a plan view showing wire connection between the circuit substrate and the transistors in FIG. 7. There are many gate electrodes 18, and the transistors 17 are spread in a direction perpendicular to the direction of extension of the gate electrodes 18. Accordingly, the electrical length $\lambda_2$ from the input of the distributed parameter transmission line 15 to the gate electrode 18 in a peripheral portion of the transistor 17 is longer than the electrical length $\lambda_1$ from the input of the distributed parameter transmission line 15 to the gate electrode 18 in a central portion of the transistor 17 ($\lambda_2>\lambda_4$).

Figure 9:
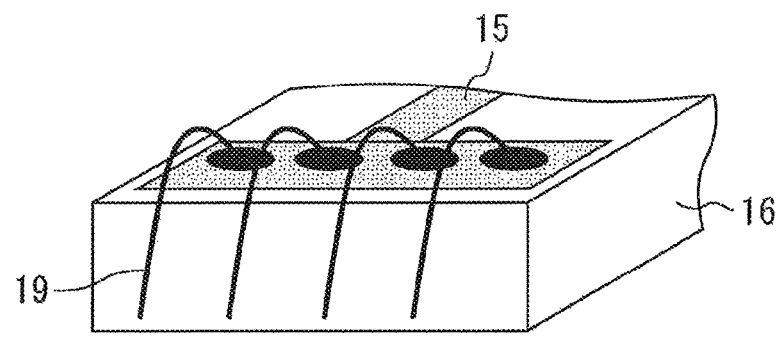
FIG. 9 is a perspective view showing an output portion of the transmission line according to the comparative example.

FIG. 9 is a perspective view showing an output portion of the transmission line according to the comparative example. The output portion of the distributed parameter transmission line 15, which is connected to a plurality of wires 19, is in the shape of a straight line, and cannot correct electrical length differences caused among the paths to the plurality of wires 19. Thus, loss occurs during synthesis and distribution, and ideal operation of the high-frequency circuit cannot be achieved.

On the other hand, this embodiment can correct electrical length differences of the transmission line 2 by varying the wire bonding positions. Thus, unintended transmission phase differences can be corrected which are produced when a high-frequency signal passes through the branched transmission line 2. It should be noted that electrical lengths are adjusted in accordance with differences among lengths on the transmission line 2, but not with the lengths of wires. The wires simply constitute unnecessary parasitic components.

Moreover, the line from a wire junction to the edge of the corresponding output portion of the transmission line 2 is an open stub. The length of the open stub increases with increasing wire length. If the parasitic inductance is large, the parallel capacitance for correction also becomes large. Accordingly, the parasitic inductance generated by the second wire 10, which is an unnecessary component, can be reduced by an open stub corresponding to the wire length on an individual wire basis. Thus, operating characteristics of the high-frequency circuit can be improved.

Moreover, the first and second output portions 4 and 5 extend to the side surface of the first substrate 1 which faces the side surface of the second substrate 6. The substrate size does not need to be increased to correct transmission phase differences, compared to that for the case where a transmission line is formed only in the same plane. Accordingly, wire lengths can be reduced at any positions. This reduces unnecessary parasitic inductance and facilitates the realization of target electrical characteristics.

The first wire 9 is bonded to the first output portion 4 on the side surface of the first substrate 1. The parasitic inductance $L_{00}$ of the short first wire 9 is smaller than the parasitic inductance $L_{00}$ of the long second wire 10. In this case, there is no open stub for correcting the parasitic inductance of the first wire 9. On the other hand, the distance between the first output portion 4 of the transmission line 2 and the ground electrode 11 becomes small, and the parallel capacitance $C_t$ increases. Accordingly, the parasitic inductance $L_{00}$ of the first wire 9 can be reduced even at a line end without an open stub. This can reduce parasitic inductance overall, and can contribute to the miniaturization of the circuit.

Embodiment 2

Figure 10:
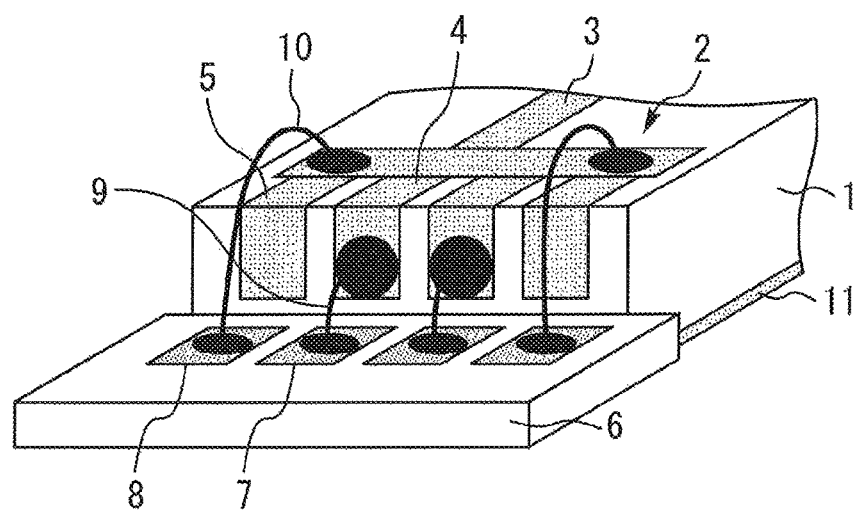
FIG. 10 is a perspective view showing a high-frequency circuit according to Embodiment 2 of the present invention.

FIG. 10 is a perspective view showing a high-frequency circuit according to Embodiment 2 of the present invention. The second wire 10 is connected to a farther position on the second output portion 5 away from the edge thereof compared to that of Embodiment 1. This increases the length of the second wire 10. However, the length of the open stub is also increased, and therefore the parasitic inductance generated by the second wire 10, which is an unnecessary component, can be reduced. Accordingly, electrical length differences can be corrected to improve operating characteristics as in Embodiment 1.

Embodiment 3

Figure 11:
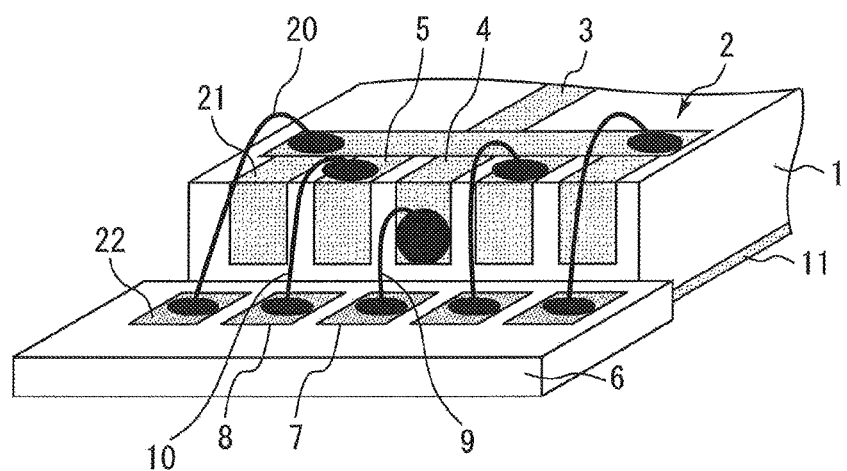
FIG. 11 is a perspective view showing a high-frequency circuit according to Embodiment 3 of the present invention.

FIG. 11 is a perspective view showing a high-frequency circuit according to Embodiment 3 of the present invention. As in Embodiment 1, the first wire 9 is bonded to the first output portion 4 on the side surface of the first substrate 1, and the second wire 10 is bonded to the second output portion 5 on the upper surface of the first substrate 1. A third wire 20 connects a third output portion 21 to a third pad 22. The third wire 20 is connected to a farther position on the third output portion 21 away from the edge thereof compared to the second wire 10. In this case, electrical length differences can also be corrected to improve operating characteristics as in Embodiment 1.

Embodiment 4

Figure 12:
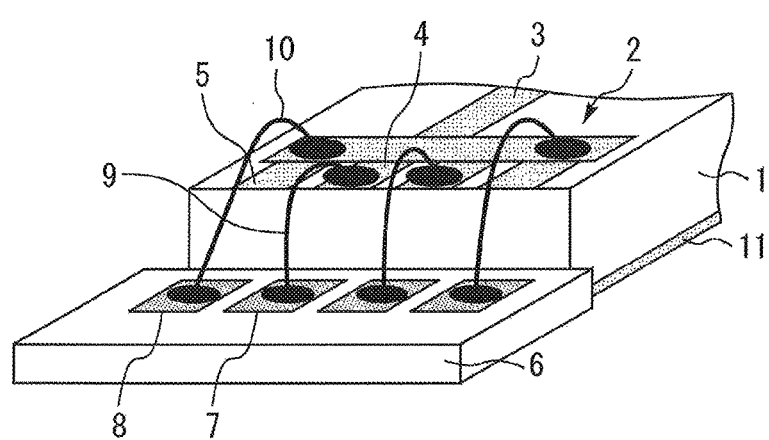
FIG. 12 is a perspective view showing a high-frequency circuit according to Embodiment 4 of the present invention.

FIG. 12 is a perspective view showing a high-frequency circuit according to Embodiment 4 of the present invention. The first and second output portions 4 and 5 do not extend to the side surface of the first substrate 1. The first and second wires 9 and 10 are bonded to the first and second output portions 4 and 5 on the upper surface of the first substrate 1. The second wire 10 is connected to a farther position on the second output portion 5 away from the edge thereof compared to the first wire 9. In this case, electrical length differences can also be corrected to improve operating characteristics as in Embodiment 1.

An electrical length in the circuit varies in an analog manner. By selecting various connection methods such as shown in Embodiments 1 to 4, electrical length variations can be efficiently corrected. Moreover, the degree of freedom of correction can be improved. Accordingly, operating characteristics of the internally-matched high-frequency circuit can be further improved.

In the circuit example shown in FIGS. 7 and 8, the electrical length of each of the distributed ports depends on the port position with reference to the circuit and the port position with reference to the corresponding transistor, and electrical length variations are complicated. Accordingly, a wire connection method which optimizes the circuit as a whole is selected while wire connections other than those of Embodiments 1 to 4 are also being combined.

Embodiment 5

Figure 13:
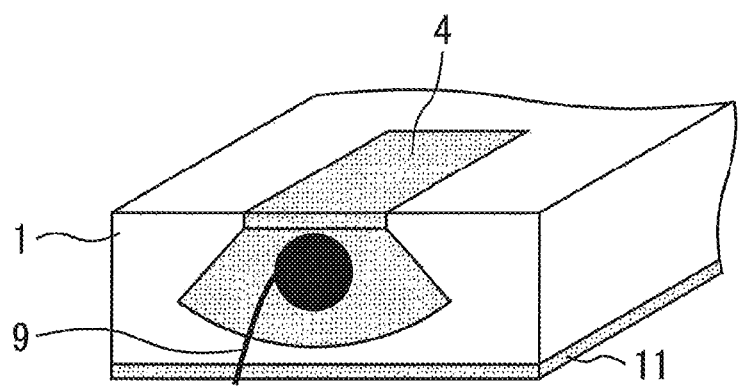
FIG. 13 is a perspective view showing an output portion of a transmission line of a high-frequency circuit according to Embodiment 5 of the present invention.

FIG. 13 is a perspective view showing an output portion of a transmission line of a high-frequency circuit according to Embodiment 5 of the present invention. The first output portion 4 is fan-shaped on the side surface of the first substrate 1, and the second output portion 5 is the same as that of Embodiment 1. Accordingly, the areas of the first and second output portions 4 and 5 on the side surface of the first substrate 1 are different from each other. By changing the area of the first output portion 4 on the side surface of the first substrate 1 in this way, the parallel capacitance between the first output portion 4 and the ground electrode 11 can be adjusted. Thus, the influence of parasitic inductance can be more effectively reduced.

Embodiment 6

Figure 14:
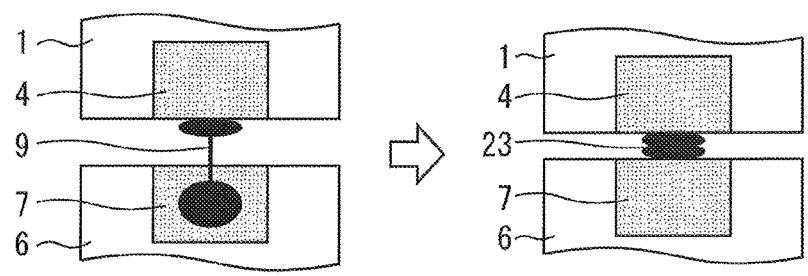
FIG. 14 is a top view showing the junction between the first and second substrates according to Embodiment 1 or 6 of the present invention.

FIG. 14 is a top view showing the junction between the first and second substrates according to Embodiment 1 or 6 of the present invention. Embodiment 1 requires a certain distance between the substrates for connecting the first wire 9. On the other hand, this embodiment uses a bump 23 instead of the first wire 9. Accordingly, the substrates can be arranged very close to each other. Further, parasitic inductance can be reduced.

Moreover, if the thicknesses of the first and second substrates 1 and 6 are equivalent, wire connection between facing side surfaces is difficult. Embodiment 1 requires, for wire connection, a level difference provided on a base portion on which the substrates are placed. On the other hand, this embodiment does not require such a level difference, and can be easily fabricated.

Embodiment 7

Figure 15:
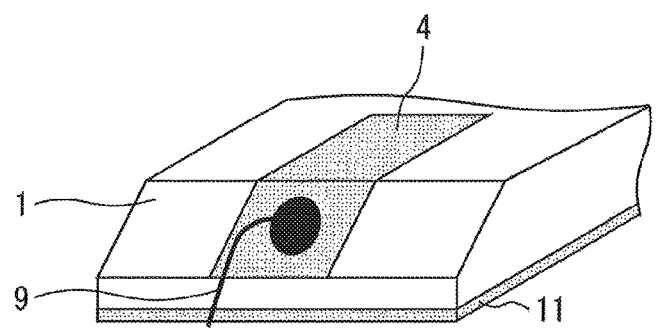
FIG. 15 is a perspective view showing a first substrate according to Embodiment 7 of the present invention.

FIG. 15 is a perspective view showing a first substrate according to Embodiment 7 of the present invention. The side surface of the first substrate 1 is tapered, thus facilitating the connection of the first wire 9. The assembly process becomes stabilized, and the risk of failure occurrence can be reduced. Except for the above-described points, the configuration and effects of this embodiment are the same as those of Embodiment 1. It should be noted that if the thicknesses of the substrates are equivalent, this structure can be realized without providing a level difference in a base portion on which the substrates are placed.

In Embodiments 1 to 7, the cases where the first substrate 1 is a transmission line substrate and where a transistor is formed on the second substrate 6 have been described. The present invention is not limited to these. Both of the first and second substrates 1 and 6 may be transmission line substrates.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-219868, filed on Nov. 10, 2016 including specification, claims, drawings and summary, on which the Convention priority of the present application is based, is incorporated herein by reference in its entirety.

The invention claimed is:

1. A high-frequency circuit comprising:
   a first substrate;
   a transmission line formed on the first substrate and having first and second output portions branched from an input portion;
   a second substrate;
   first and second pads formed on the second substrate;
   a first wire connecting the first output portion to the first pad; and
   a second wire connecting the second output portion to the second pad, wherein
   a first electrical length from the input portion to an edge of the second output portion is longer than a second electrical length from the input portion to an edge of the first output portion,
   a first length from a first junction between the second wire and the second output portion to the edge of the second output portion is longer than a second length from a second junction between the first wire and the first output portion to the edge of the first output portion, and
   the first length constitutes an open stub to compensate for a phase difference created by a difference between the first and second electrical length.

2. The high-frequency circuit according to claim 1, wherein the first and second output portions extend to and onto a side surface of the first substrate which faces a side surface of the second substrate.

3. The high-frequency circuit according to claim 2, wherein the first wire is bonded to the first output portion on the side surface of the first substrate.

4. The high-frequency circuit according to claim 3, further comprising a ground electrode formed on a back surface of the first substrate.

5. The high-frequency circuit according to claim 3, wherein the first wire is a bump.

6. The high-frequency circuit according to claim 3, wherein the side surface of the first substrate is tapered.

7. The high-frequency circuit according to claim 4, wherein areas of the first and second output portions on the side surface of the first substrate are different from each other.

8. The high-frequency circuit according to claim 1, wherein the first and second substrates are transmission line substrates.

9. A high-frequency circuit comprising,
a first substrate;
a transmission line formed on the first substrate and having first and second output portions branched from an input portion;
a second substrate;
first and second pads formed on the second substrate;
a first wire connecting the first output portion to the first pad; and
a second wire connecting the second output portion to the second pad,
wherein an electrical length from the input portion to an edge of the second output portion is longer than an electrical length from the input portion to an edge of the first output portion, and
a length from a junction between the second wire and the second output portion to the edge of the second output portion is longer than a length from a junction between the first wire and the first output portion to the edge of the first output portion, wherein
the first substrate is a transmission line substrate, a transistor is formed on the second substrate, and the first and second pads are connected to a gate of the transistor.

10. The high-frequency circuit according to claim 9, wherein the first and second output portions extend to and onto a side surface of the first substrate which faces a side surface of the second substrate.

11. The high-frequency circuit according to claim 10, wherein the first wire is bonded to the first output portion on the side surface of the first substrate.

12. The high-frequency circuit according to claim 11, further comprising a ground electrode formed on a back surface of the first substrate.

13. The high-frequency circuit according to claim 11, wherein the first wire is a bump.

14. The high-frequency circuit according to claim 11, wherein the side surface of the first substrate is tapered.

15. The high-frequency circuit according to claim 12, wherein areas of the first and second output portions on the side surface of the first substrate are different from each other.

16. The high-frequency circuit according to claim 9, wherein the first and second substrates are transmission line substrates.

17. A high-frequency circuit comprising:
a first substrate;
a transmission line formed on the first substrate and having first and second output portions branched from an input portion;
a second substrate;
first and second pads formed on the second substrate;
a first wire connecting the first output portion to the first pad; and
a second wire connecting the second output portion to the second pad,
wherein an electrical length from the input portion to an edge of the second output portion is longer than an electrical length from the input portion to an edge of the first output portion, and
a shortest distance from a junction between the second wire and the second output portion to the edge of the second output portion closest to the second substrate is longer than a shortest distance from a junction between the first wire and the first output portion to the edge of the first output portion closest to the second substrate.

18. The high-frequency circuit according to claim 17, wherein the first and second output portions extend to and onto a side surface of the first substrate which faces a side surface of the second substrate.

19. The high-frequency circuit according to claim 18, wherein the first wire is bonded to the first output portion on the side surface of the first substrate.

20. The high-frequency circuit according to claim 17, wherein the first substrate is a transmission line substrate, a transistor is formed on the second substrate, and the first and second pads are connected to a gate of the transistor.

* * * * *